United States Patent
Ahn (10) Patent No.: US 7,282,686 B2
(45) Date of Patent: Oct. 16, 2007

(54) IMAGE SENSOR WITH IMPROVED PHOTO SENSITIVITY

(75) Inventor: Jung-Chak Ahn, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 78 days.

(21) Appl. No.: 11/189,184

(22) Filed: Jul. 26, 2005

(65) Prior Publication Data

US 2006/0027732 A1    Feb. 9, 2006

(30) Foreign Application Priority Data

Jul. 27, 2004  (KR) .................. 10-2004-0058504

(51) Int. Cl.
- H01L 27/00 (2006.01)
- H01L 31/00 (2006.01)
- H01L 31/062 (2006.01)
- H01L 31/0232 (2006.01)
- G02B 27/10 (2006.01)
- H04N 3/14 (2006.01)
- H04N 5/225 (2006.01)

(52) U.S. Cl. .................. 250/208.1; 250/214.1; 359/619; 257/290; 257/432; 348/272; 348/340

(58) Field of Classification Search ............ 250/208.1, 250/214.1, 216; 257/432, 435, 431, 290, 257/291, 440; 359/618, 619, 891, 620, 621, 359/626, 622; 348/264, 265, 272, 294, 340
See application file for complete search history.

(56) References Cited

U.S. PATENT DOCUMENTS

| | | | | |
|---|---|---|---|---|
| 5,997,756 | A | * 12/1999 | Okazaki et al. | 216/26 |
| 6,249,034 | B1 | * 6/2001 | Li | 257/432 |
| 2001/0026322 | A1 | 10/2001 | Takahashi et al. | |
| 2004/0135066 | A1 | * 7/2004 | Lim | 250/208.1 |

OTHER PUBLICATIONS

Japanese Patent Application No. 08-186217 to Ide, having Publication date of Feb. 3, 1998 (w/ English Abstract page).
Japanese Patent Application No. 11-343029 to Suzuki et al., having Publication date of Jun. 12, 2001 (w/ English Abstract page).
Korean Patent Application No. 1020010044945 to Kwon, having Publication date of Feb. 5, 2003 (w/ English Abstract page).

* cited by examiner

Primary Examiner—Georgia Epps
Assistant Examiner—Don Williams
(74) Attorney, Agent, or Firm—Monica H. Choi (57) ABSTRACT

An image sensor includes a plurality of micro-lenses and a plurality of light receiving elements. Each micro-lens has a neighboring micro-lens at a respective distance that decreases with an incident angle of light converged by the micro-lens. Each light receiving element has a neighboring light receiving element at a respective distance that increases with an incident angle of light received by the light receiving element. Such position adjustment of the micro-lenses and light receiving elements enhances photo sensitivity of the image sensor.

16 Claims, 9 Drawing Sheets

IMAGE SENSOR WITH IMPROVED PHOTO SENSITIVITY

BACKGROUND OF THE INVENTION

This application claims priority to Korean Patent Application No. 2004-58504 filed on Jul. 27, 2004 in the Korean Intellectual Property Office, the entire contents of which are hereby incorporated by reference.

1. Field of the Invention

The present invention relates generally to image sensors, and in particular to an image sensor having adjusted spacing between micro-lenses and light receiving elements for improved photo sensitivity.

2. Description of the Related Art

An image sensor is generally implemented using semiconductor for converting light into electric signals. Recently, image sensors are classified into two types, i.e. a CCD (Charge Coupled Device) image sensor and a CMOS (Complementary Metal Oxide Semiconductor) image sensor.

The CCD image sensor accumulates electric charges generated in proportion to an intensity of light in each pixel. Such electric charge is converted into a voltage that is buffered and provided to an external device.

The CMOS image sensor includes control circuits and signal processing circuits as peripheral circuits. The CMOS image sensor also includes MOS (metal oxide semiconductor) transistors in each pixel for generating an output voltage at each pixel. The CMOS image sensor has low power consumption and is able to operate using a single power supply. Additionally, the CMOS image sensor is easier to drive, and the manufacturing process for the CMOS image sensor is simpler than for the CCD image sensor. Thus recently, the CMOS image sensor has been widely used in mobile devices.

The photo sensitivity of an image sensor is desired to be maximized, such as by a light convergence technique. Generally, the image sensor includes light receiving elements and logic circuits for converting light to an electric signal. When the size of the light receiving elements is increased, the intensity of received light is improved, but a total size of the image sensor is disadvantageously increased. The light convergence technique improves photo sensitivity while maintaining a smaller size of the image sensor.

Figure 1:
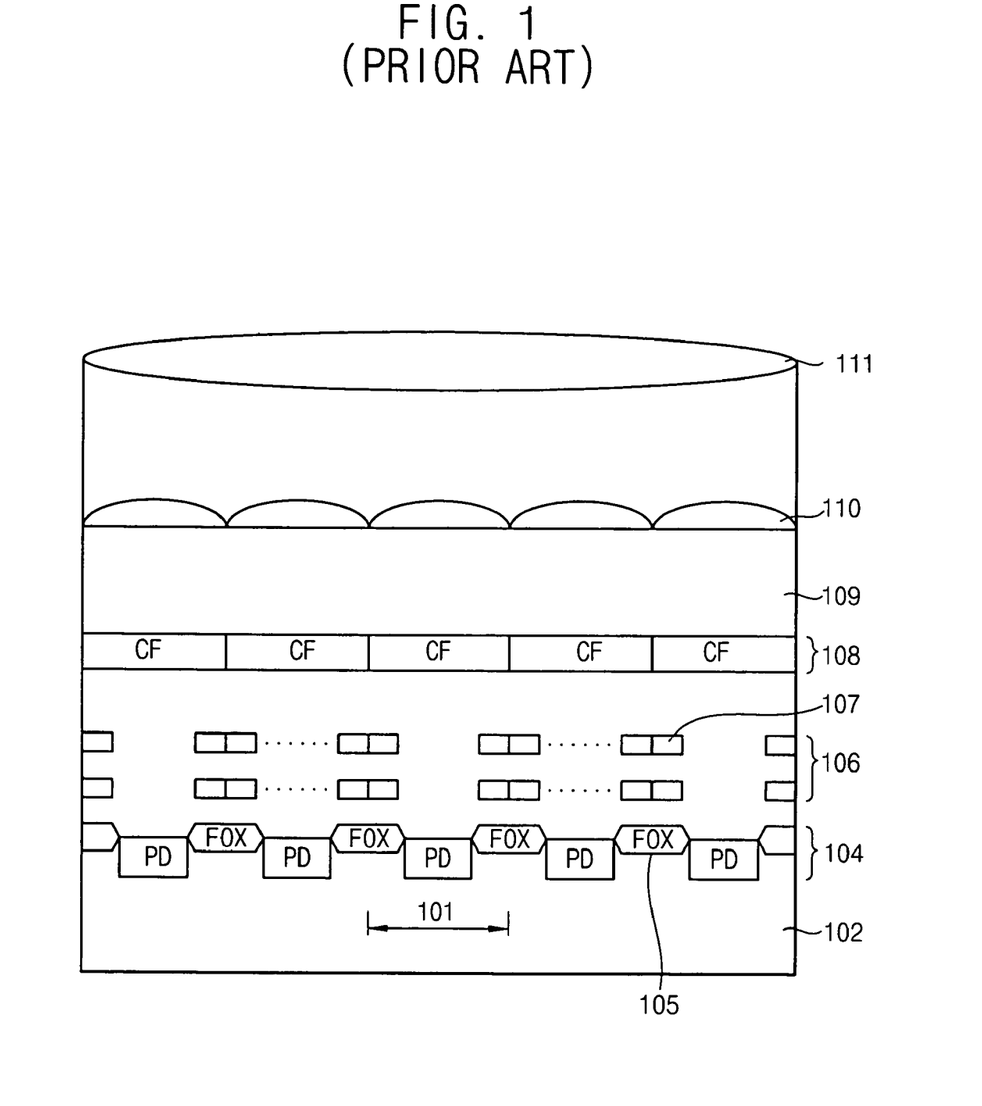
FIG. 1 shows a cross-sectional view of a pixel array of a first conventional CMOS (Complementary Metal Oxide Semiconductor) image sensor.

FIG. 1 shows a cross-sectional view of a pixel array of a first conventional CMOS (Complementary Metal Oxide Semiconductor) image sensor (CIS). Referring to FIG. 1, the first conventional CIS includes a semiconductor substrate 102, an element layer 104, a metal layer 106, a color filter array 108, a coating layer 109, a micro-lens array 110, and an objective lens 111.

The element layer 104 is formed on the semiconductor substrate 102. The element layer 104 includes a plurality of pixels 101 composed of photodiodes PD used as light receiving elements and MOS (Metal Oxide Semiconductor) transistors (not shown in FIG. 1). Insulating structures 105 are formed for separating the photodiodes PD. The metal layer 106 is formed over the element layer 104, and includes a plurality of metal wires formed in a multi-layered configuration.

The color filter array 108 is formed over the metal layer 106. The coating layer 109 is formed on the color filter array 108 for controlling a focal distance to the photodiodes PD. A respective micro-lens is formed on the coating layer 109 in the micro-lens array 110 for converging light onto each of the photodiodes PD.

Each micro-lens has a predetermined refraction angle based on a size of a unit pixel 101 and a height or a disposition of the metal layer 106. Each micro-lens has a larger size than the corresponding photodiode PD below. The refraction angle for a micro-lens is determined by a thickness and a curvature radius of the micro-lens.

The objective lens 111 formed over the micro-lens array 110 condenses light onto the micro-lens array 110, and is supported by a CMOS image sensor module. The objective lens 111 has a predetermined refraction angle based on a size and a height of a CMOS image sensor module. The refraction angle of the objective lens 111 is determined by a thickness and a curvature radius of the objective lens 111.

Figure 2:
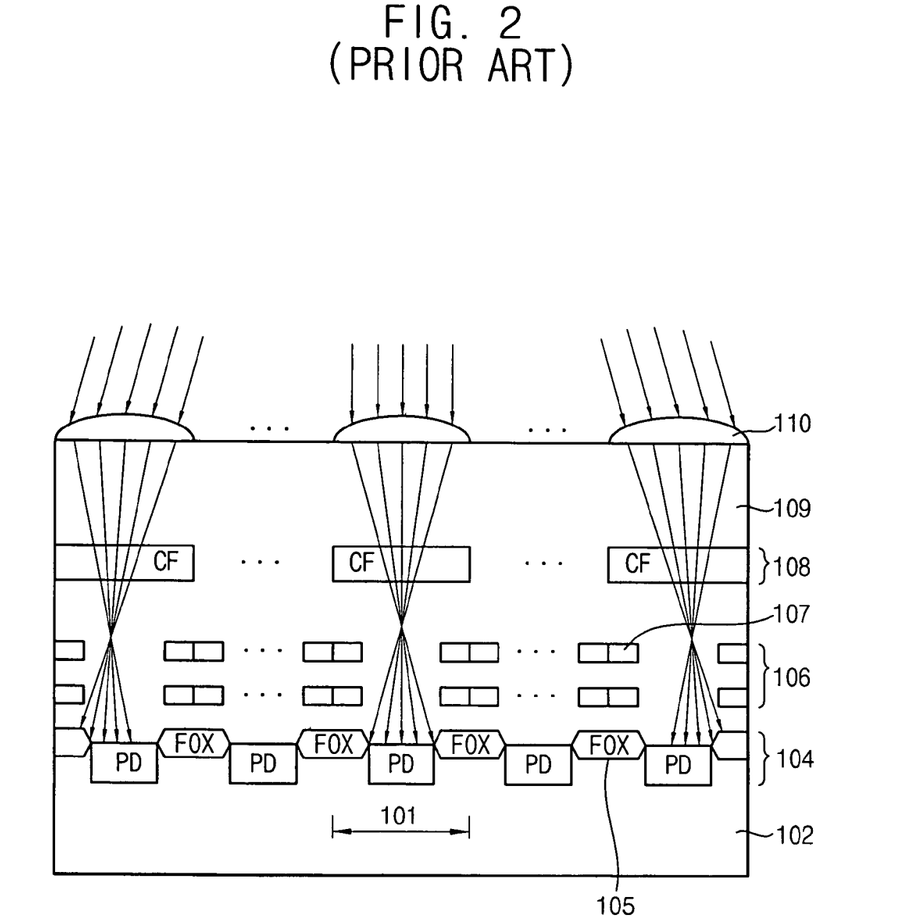
FIG. 2 shows the pixel array of FIG. 1 with light converged onto light receiving elements.

FIG. 2 shows the first pixel array of FIG. 1 converging light onto the light receiving elements PD. Referring to FIG. 2, light is incident on the objective lens 111 (not shown in FIG. 2) that condenses such light onto the micro-lens array 110 according the refraction angle of the objective lens 111. Such light is further refracted by each of the micro-lenses 110 onto the photodiodes PD.

In such a CMOS image sensor structure of FIG. 2, a photodiode PD disposed in a center of the pixel array has maximum light intensity. Such a center of the pixel array is for a center pixel having an incident angle of light along an optical axis of the objective lens 111.

Meanwhile other photodiodes PD in peripheral portions of the pixel array, for example near ends of the pixel array, receive light of considerably lower intensity from variation of incident angles of light. As a result, such photodiodes PD in peripheral portions of the pixel array have undesirable photo sensitivity.

Figure 3A:
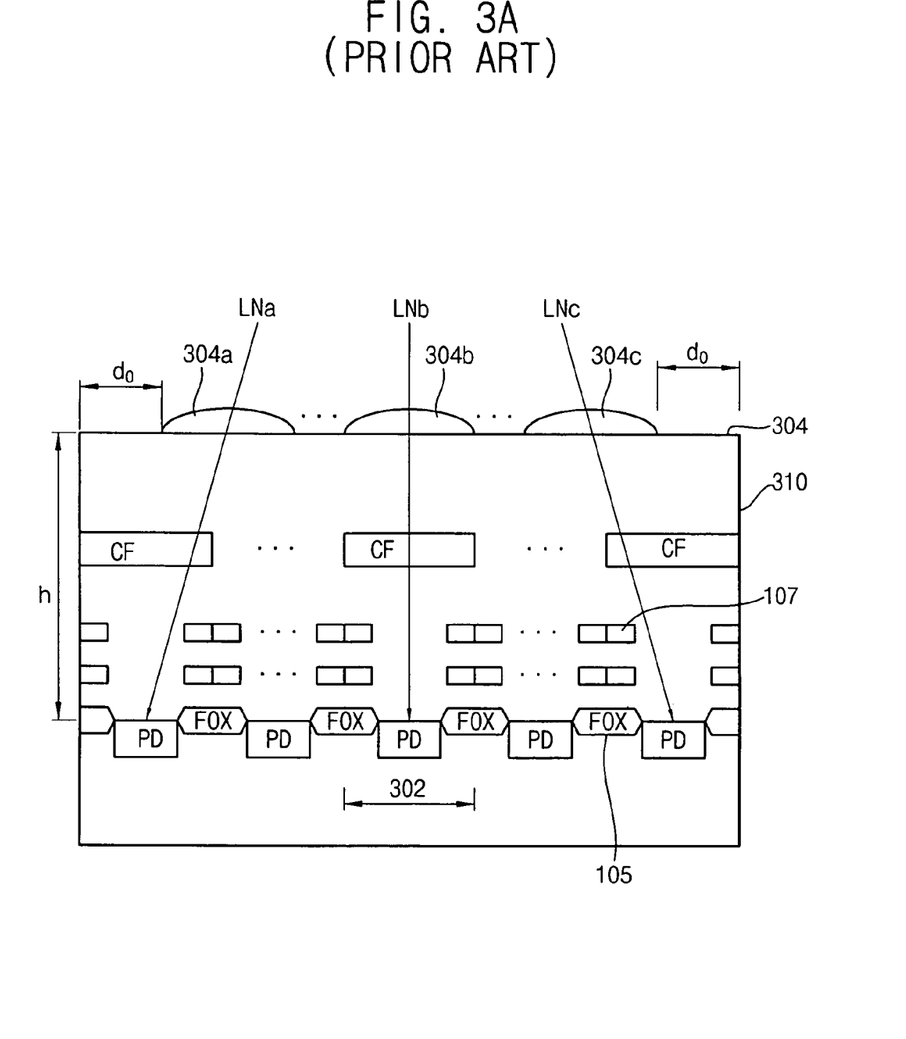
FIG. 3A shows a cross-sectional view of a pixel array of a second conventional CMOS image sensor.

FIG. 3A shows a cross-sectional view of a pixel array of a second conventional CMOS image sensor. Referring to FIG. 3A, for maximizing intensity of light received at the photodiodes PD, centers of the micro-lenses 304a, 304b and 304c are disposed along the line segments Lna, LNb, and LNc between centers of corresponding photodiodes PD and a center of the objective lens (not shown in FIG. 3A). For the purpose of simplicity, FIG. 3A shows light passing through a center portion of the objective lens with maximum light intensity.

Figure 3B:
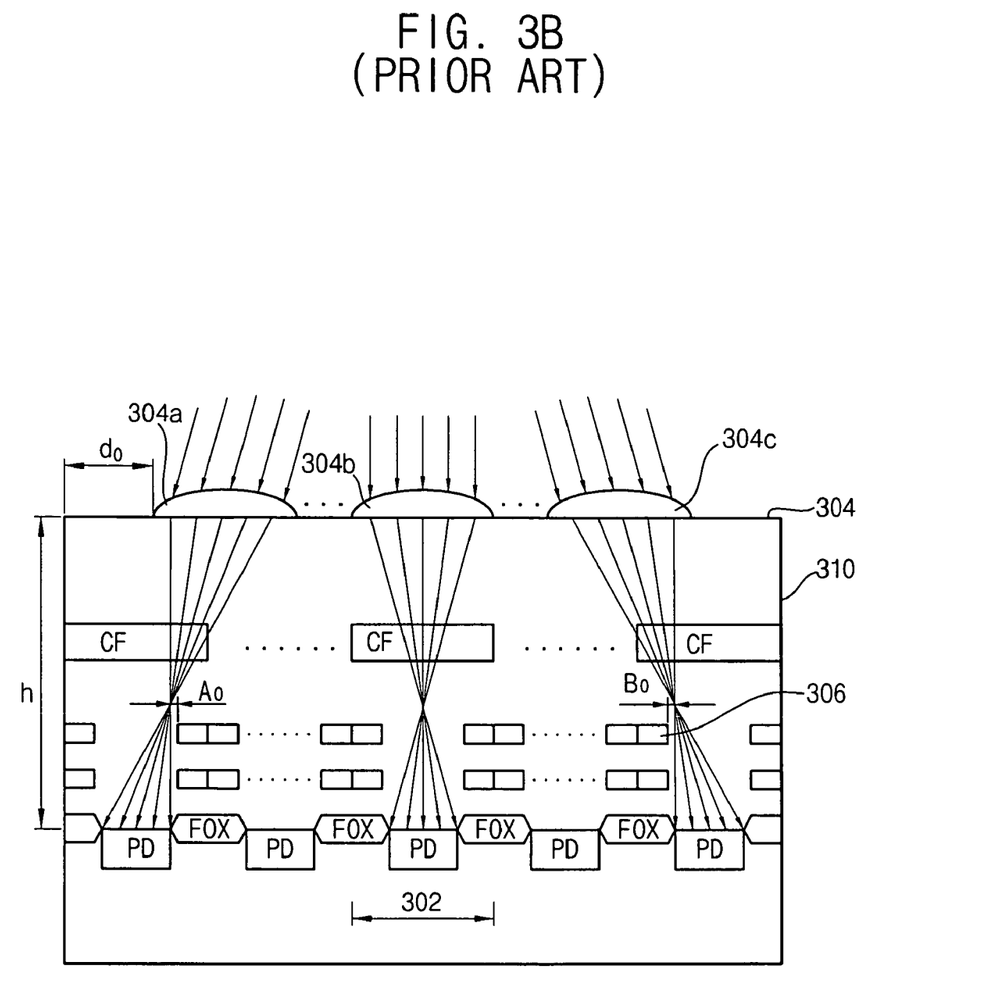
FIG. 3B shows the pixel array of FIG. 3A with light converged onto light receiving elements.

FIG. 3B shows the second pixel array of FIG. 3A with light converging on light receiving elements PD. Referring to FIG. 3B, the incident angle of light increases toward the ends of the pixel array from a center of the pixel array. The spacing between neighboring micro-lenses in FIG. 3B are narrower than those in FIG. 2. Therefore, each of the micro-lenses 304a and 304c in FIG. 3A is spaced from a respective end of the CMOS image sensor module 310 by a predetermined distance $d_0$.

The predetermined distance $d_0$ is proportional to the incident angle of light incident on the micro-lenses 304a and 304c and to a distance h between the micro-lens array 304 and the photodiodes PD. The CMOS image sensor of FIGS. 3A and 3B more efficiently prevent crosstalk and light shielding effect than the CMOS image sensor of FIGS. 1 and 2. However, when a pixel size is reduced or when the number of metal structures in the metal layer 306 is increased, the light shielding effect may predominate.

In that case, light travels very close to the metal structures of the metal layer 306 (as shown by the distances $A_0$ and $B_0$ in FIG. 3B). Such metal structures may block or scatter light away from the photodiodes PD resulting in reduced photo sensitivity.

Figure 4:
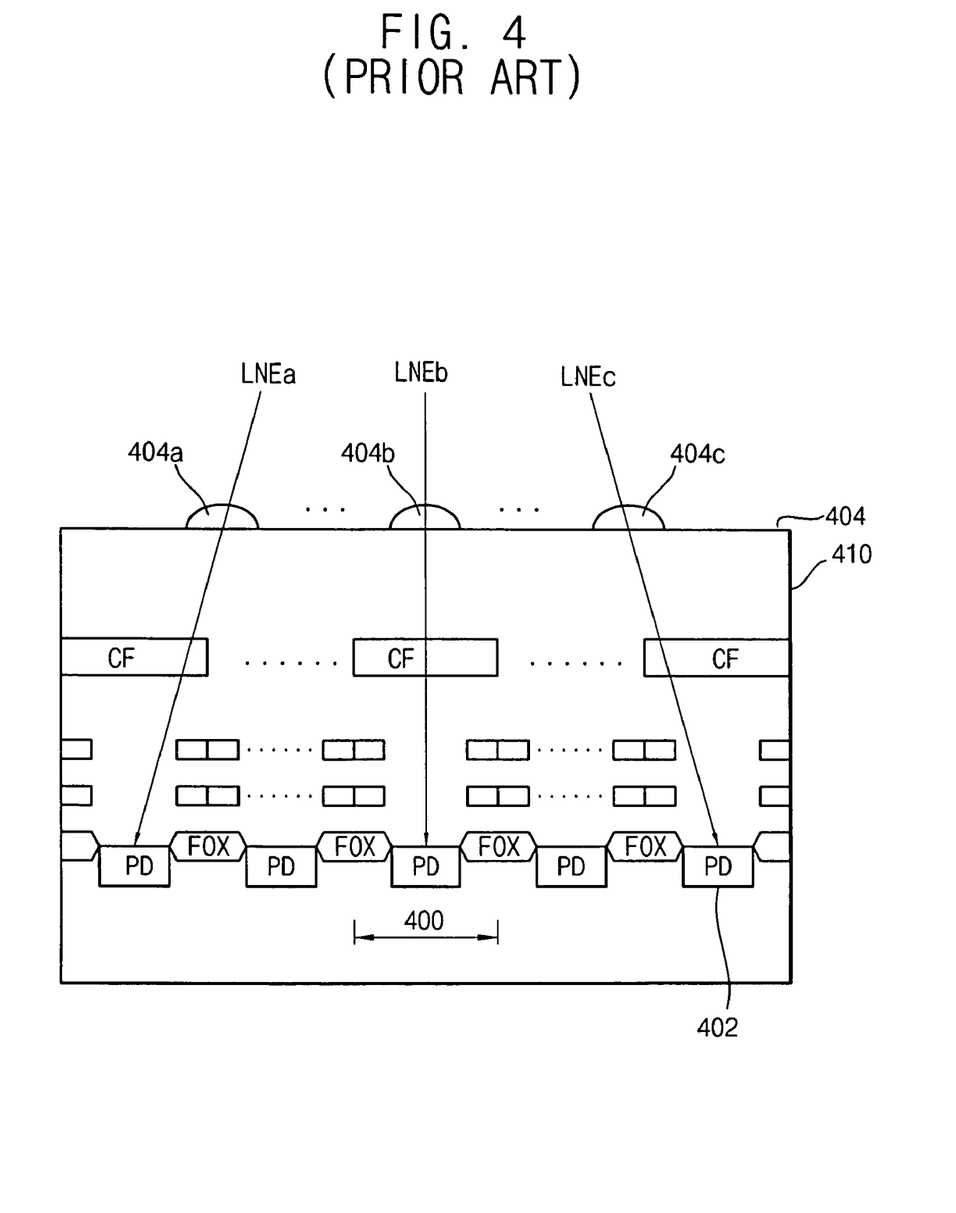
FIG. 4 shows a cross-sectional view of a pixel array of a third conventional CMOS image sensor.

FIG. 4 shows a cross-sectional view of a pixel array of a third conventional CMOS image sensor disclosed in Japanese patent number 10-32762. Referring to FIG. 4, centers of each of the photodiodes PD are formed at ends of line segments LNEa, LNEb, and LNEc drawn between a center of the objective lens (not shown) and centers of the micro-lenses 404a, 404b, and 404c, respectively. The CIS of FIG. 4 prevents crosstalk and shading effect. However, a size of the CIS of FIG. 4 may increase since the light receiving elements PD are shifted toward ends of the CIS module 410 in proportion to an incident angle of light and a distance between the micro-lenses 404a, 404b, and 404c and the photodiodes PD.

SUMMARY OF THE INVENTION

Accordingly, in image sensors according to embodiments of the present invention, the positioning of the micro-lenses and the light receiving elements are adjusted for heightened photo sensitivity with small size of the image sensor.

An image sensor according to one embodiment of the present invention includes a plurality of micro-lenses. Each micro-lens has a neighboring micro-lens at a respective distance that decreases with an incident angle of light converged by the micro-lens. In addition, the image sensor also includes a plurality of light receiving elements. Each light receiving element has a neighboring light receiving element at a respective distance that increases with an incident angle of light received by the light receiving element.

In an example embodiment of the present invention, the micro-lenses are arranged as an array in a plane above the plurality of light receiving elements. In that case, the incident angle of light converged by the micro-lens increases from a center point of the array. In addition, the light receiving elements are arranged as an array in a plane below the plurality of micro-lenses, and the incident angle of light received by the light receiving element increases from a center point of the array. In another embodiment of the present invention, each light receiving element receives light converged by a respective micro-lens.

In a further embodiment of the present invention, the image sensor includes an objective lens disposed above the micro-lenses, and the incident angle of light is with respect to an optical axis of the objective lens.

In another embodiment of the present invention, the image sensor includes a plurality of color filters disposed between the micro-lenses and the light receiving elements. Each color filter has a neighboring color filter at a respective distance that decreases with an incident angle of light filtered by the color filter.

In a further embodiment of the present invention, the image sensor includes a plurality of metal structures disposed between the micro-lenses and the light receiving elements. Each metal structure has a neighboring metal structure at a respective distance that decreases with an incident angle of light.

In another embodiment of the present invention, the micro-lenses are arranged in blocks, and each block has a neighboring block at a respective distance that decreases with the incident angle of light converged by the micro-lenses in the block. Furthermore, a distance between neighboring micro-lenses within each block decreases with the incident angle of light.

In a further embodiment of the present invention, the light receiving elements are arranged in blocks, and each block has a neighboring block at a respective distance that increases with the incident angle of light received by the light receiving elements in the block. Furthermore, a distance between neighboring light receiving elements within each block increases with the incident angle of light.

The present invention may be used to particular advantage when the image sensor is a CIS (CMOS image sensor). However, the present invention may also be applied for other types of image sensors.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3A, 3B, 4, 5, 6, 7A, 7B, 8A, and 8B refer to elements having similar structure and/or function.

DETAILED DESCRIPTION OF THE INVENTION

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
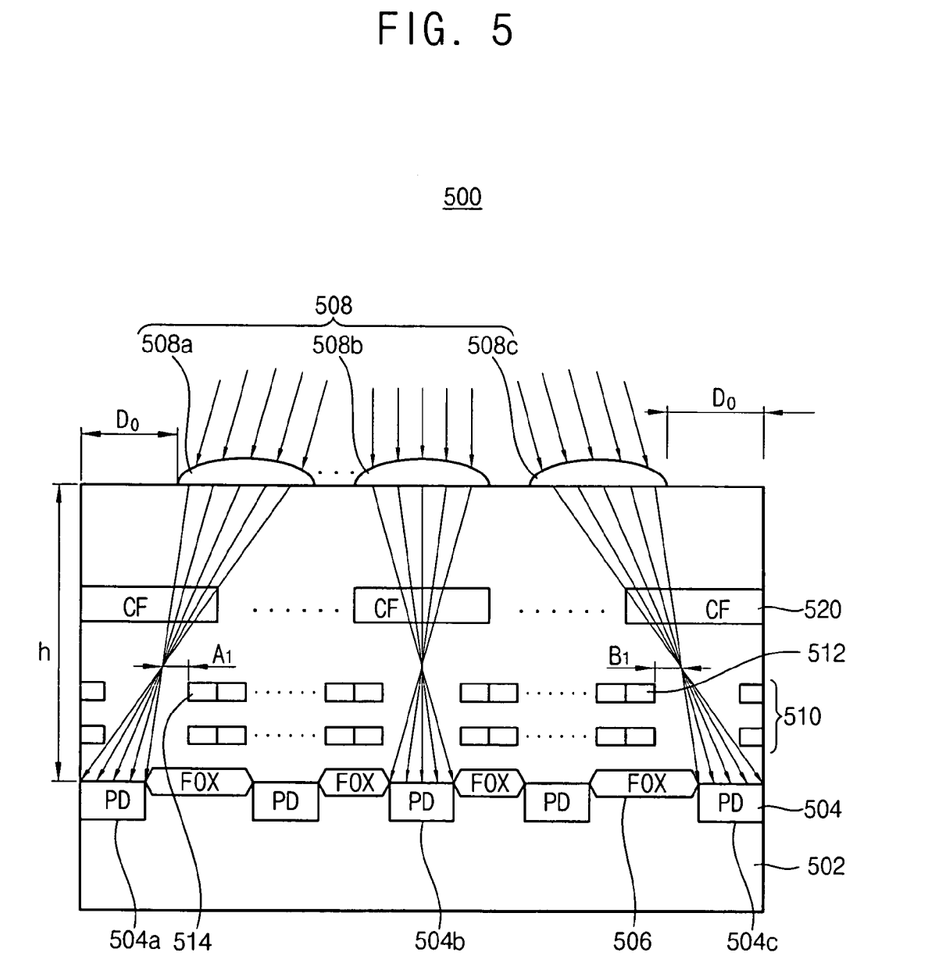
FIG. 5 shows a cross-sectional view of a pixel array of a CMOS image sensor according to an example embodiment of the present invention.

FIG. 5 shows a cross-sectional view of a pixel array of a CMOS image sensor 500 according to an example embodiment of the present invention. Referring to FIG. 5, the CMOS image sensor 500 includes a semiconductor substrate 502, an array 504 of a plurality of light receiving elements PD, a metal layer 510 of a plurality of metal wires, an array 520 of a plurality of color filters CF, an array 508 of a plurality of micro-lenses 508a, 508b, 508c, and an objective lens. The objective lens is not shown in FIG. 5 but is disposed above the array of micro-lenses 508 to condense light thereon similar to the objective lens 111 in FIG. 1.

The array 504 of light receiving elements PD is formed on the semiconductor substrate 502. For example, each light receiving element PD is a photodiode PD. Each micro-lens 508 is formed over a respective light receiving element PD for converging light onto the respective photodiode PD. The objective lens (not shown) has a predetermined refraction angle determined by a thickness and a curvature radius of the objective lens. The objective lens condenses light by refraction of such light onto the micro-lenses 508.

In an embodiment of the present invention, the spacing between neighboring micro-lenses 508 decreases with an incident angle of light received and converged by the neighboring micro-lenses. Such incident angle is with respect to an optical axis of the objective lens disposed above the micro-lenses 508. Thus, the incident angle of light is at a minimum toward a center of the array of micro-lenses 508. As a result, the spacing between neighboring micro-lenses 508 becomes narrower as the neighboring micro-lenses 508 are disposed toward the ends away from the center of the micro-lens array 508.

In this manner, each micro-lens has a neighboring micro-lens at a respective distance that decreases with an incident angle of light converged by the micro-lens. Thus, each of the micro-lenses 508a and 508c disposed toward ends of the CMOS image sensor module 500 are spaced from such ends by a distance $D_0$.

In contrast, the spacing between neighboring light receiving elements PD increases with an incident angle of light received by the neighboring micro-lenses. Such incident angle is with respect to an optical axis of the objective lens disposed above the micro-lenses 508. As a result, the spacing between neighboring light receiving elements PD becomes narrower as the neighboring micro-lenses 508 are disposed toward the center of the array 504 of light receiving elements PD. In this manner, each light receiving element PD has a neighboring light receiving element at a respective distance that increases with an incident angle of light received by the light receiving element.

Consequently, a size of the CMOS image sensor module 500 may be increased due to gradual increases in the space between adjacent photodiodes PD. In other words, a size of the light receiving element array 504 and thus of the CMOS image sensor module 500 is increased in order to improve photo sensitivity.

The extended size of the light receiving element array 504 is determined in proportion to a distance 'h' between the micro-lens array 508 and the photodiodes PD 504, and an incident angle of light incident on the peripheral micro-lenses 508a and 508c. However, because the peripheral micro-lenses 508a and 508b are shifted toward the center micro-lens 508b, the total size change of the CMOS image sensor 500 is small.

Comparing FIGS. 3B and 5, the distances $A_1$ and $B_1$ from the metal structures 510 in FIG. 5 are increased from such adjustment of the positions of the micro-lenses 508. Thus, $A_1 > A_0$ and $B_1 > B_0$ such that the photodiodes PD 504a and 504c disposed towards ends of the light receiving element array 504 have desired photo sensitivity.

In addition, the color filter array 520 and the plurality of metal structures of the metal layer 510 may be arranged similarly to the micro-lens array 508. Namely, each color filter CF has a neighboring color filter at a respective distance that decreases with an incident angle of light filtered by the color filter. In addition, each metal structure 512 has a neighboring metal structure at a respective distance that decreases with an incident angle of light.

Figure 6:
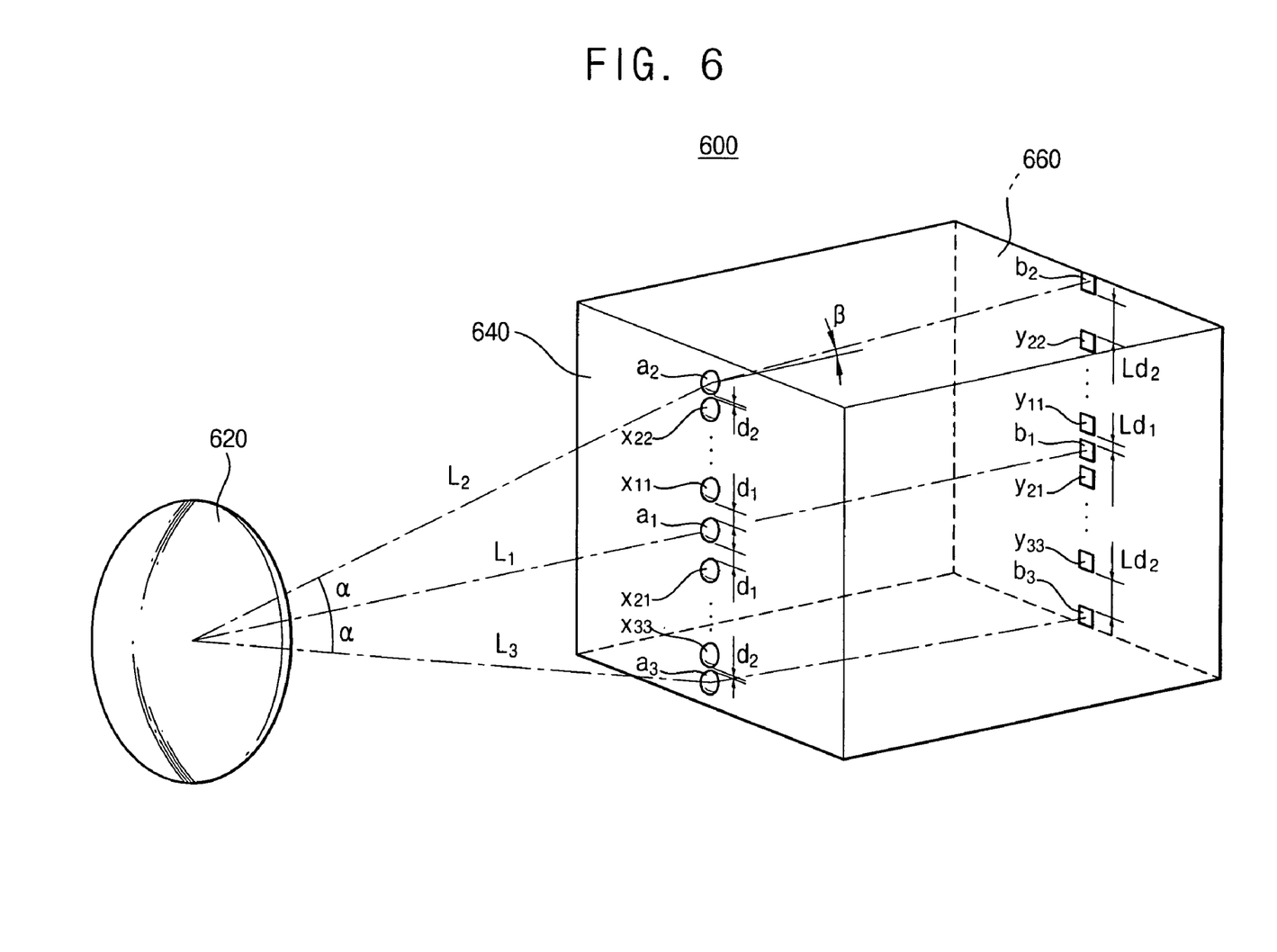
FIG. 6 is a schematic diagram of light paths through the CMOS image sensor of FIG. 5, according to an example embodiment of the present invention.

FIG. 6 shows a schematic diagram of light paths through the CMOS image sensor of FIG. 5. For the purpose of simplicity, FIG. 6 shows a center light path passing through the objective lens 620 with maximum light intensity. FIG. 6 shows just several micro-lenses a1, a2, a3, x11, x21, x22, x33 disposed in a center and toward ends of the micro-lens array 640, and just several light receiving elements b1, b2, b3, y11, y21, y22, y33 disposed in a center and toward ends of the light receiving element array 660.

Referring to FIG. 6, the first light path L1 traveling along an optical axis of the objective lens 620 is transmitted to the micro-lens a1 disposed at a center of the micro-lens array 640. Such light L1 is converged by the micro-lens a1 onto the light receiving element b1 disposed at a center of the light receiving element array 660. The light receiving element b1 receives light of maximum intensity since the incident angle of the first light path L1 is substantially zero with respect to the optical axis of the objective lens 620.

Each of a second light path L2 and a third light path L3 is formed through the micro-lenses a2 and a3, respectively, disposed toward ends of the micro-lens array 640. Each of such light paths L2 and L3 has a predetermined incident angle α with respect to the optical axis of the objective lens 620.

The micro-lenses a2 and a3 each converge such lights L2 and L3 onto the light receiving elements b2 and b3, respectively, disposed toward ends of the light receiving element array 660 with a predetermined incident angle β with respect to the optical axis of the objective lens 620.

Each of micro-lenses x11 and x21 neighbors the center micro-lens a1 with a distance d1 from the micro-lens a1. Each of micro-lenses x22 and x33 neighbors a respective one of the micro-lens a2 and a3 with a distance d2 that is less than d1. In one embodiment of the present invention, the spacing between neighboring micro-lenses x11/x21 and a1 is a maximum, and the spacing between neighboring micro-lens x22 and a2 or between x33 and a3 is a minimum.

Further in FIG. 6, each of light receiving elements y11 and y22 neighbors the center light receiving element b1 with distance Ld1. In addition, each of light receiving elements y22 and y33 neighbors a respective one of the light receiving elements b2 and b3 with a distance Ld2 greater than Ld1. The spacing between neighboring light receiving elements is increased toward ends of the light receiving element array 660 from the center light receiving element b1.

In one embodiment of the present invention, the spacing between neighboring light receiving elements y11/y22 and b1 is a minimum, and the spacing between neighboring light receiving elements y22 and b2 or between y33 and b3 is a maximum.

Figure 7A:
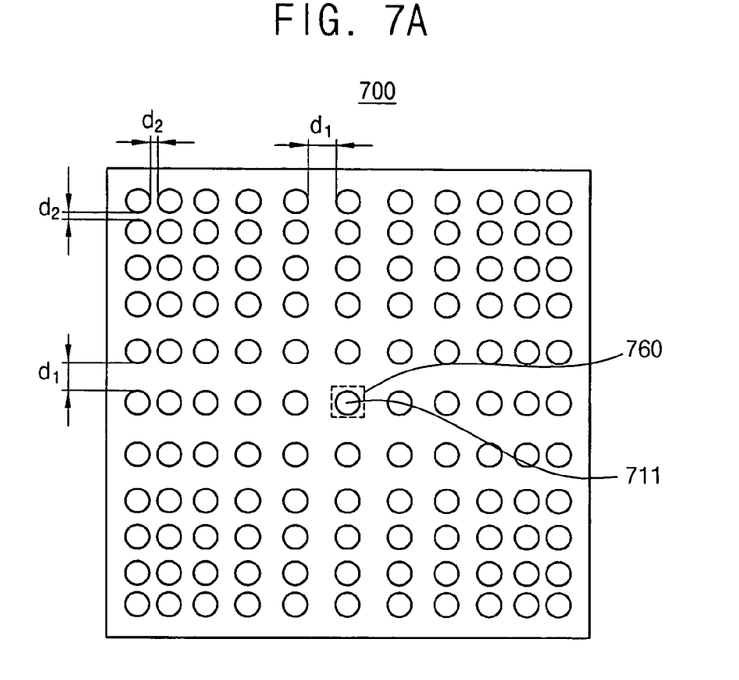
FIG. 7A shows an arrangement of a plurality of micro-lenses in the CMOS image sensor of FIG. 5, according to an example embodiment of the present invention.
Figure 7B:
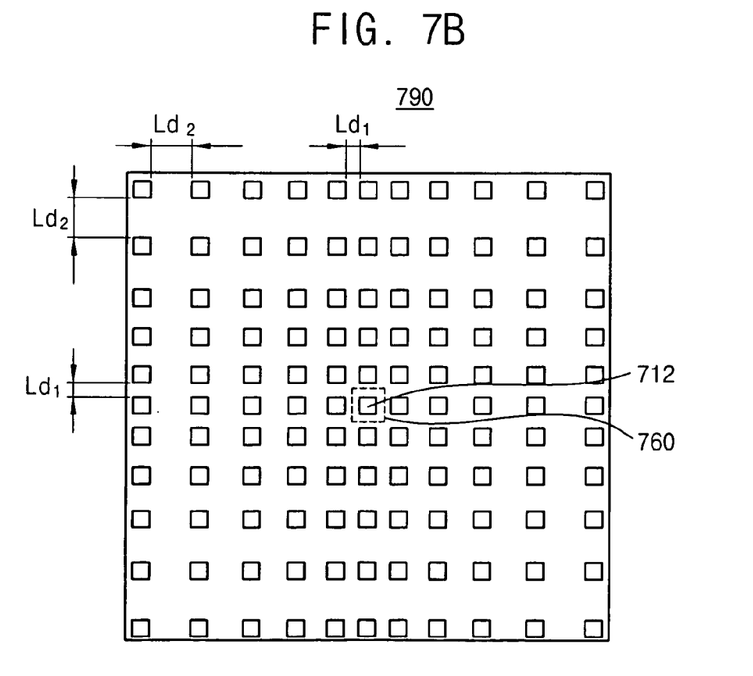
FIG. 7B shows an arrangement of a plurality of light receiving elements in the CMOS image sensor of FIG. 5, according to an example embodiment of the present invention.

FIG. 7A shows an arrangement of a plurality of micro-lenses, and FIG. 7B shows an arrangement of a plurality of light receiving elements, in the CMOS image sensor of FIG. 5 according to an example embodiment of the present invention. Referring to FIGS. 7A and 7B, the micro-lens 711 disposed in a center of the micro-lens array 700 is formed over the light receiving element 712 disposed in a center of the light receiving element array 790. When a micro-lens is disposed toward an end and away from the center of the micro-lens array 700, spacing between neighboring micro-lenses is decreased. That is, $d_1$ represents a maximum spacing, and $d_2$ represents a minimum spacing in FIG. 7A.

Generally, the number of the light receiving elements/micro-lenses corresponds to the number of the pixels. FIGS. 7A, 7B, 8A and 8B each show an 11×11 pixel array for clarity and ease of illustration. However, an example VGA resolution image sensor includes 640×640 light receiving elements/micro-lenses.

Referring to FIG. 7B, the light receiving element 712 disposed in a center of the light receiving element array 790 is formed in a center portion of the unit pixel 760. When a light receiving element is disposed toward an end of the pixel array away from the center, spacing between neighboring light receiving elements is increased. That is, $Ld_1$ represents a minimum spacing, and $Ld_2$ represents a maximum spacing.

Figure 8A:
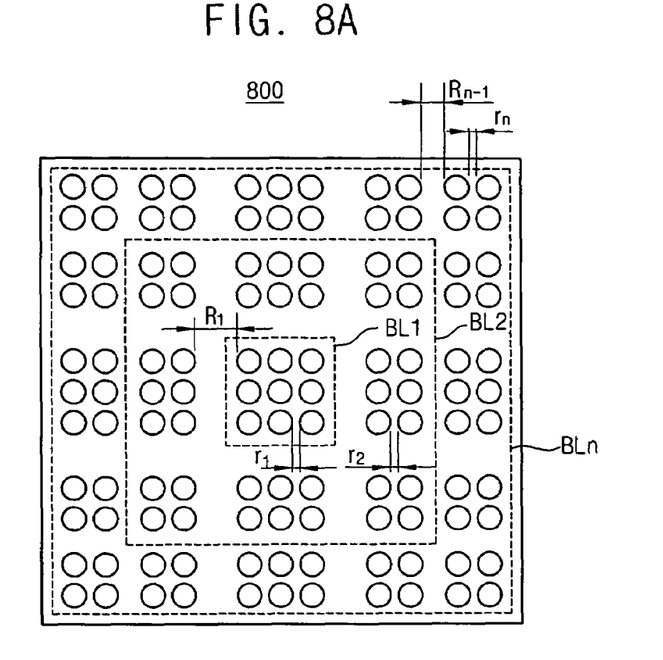
FIG. 8A shows an arrangement of a plurality of micro-lenses in blocks in the CMOS image sensor of FIG. 5, according to an example embodiment of the present invention.
Figure 8B:
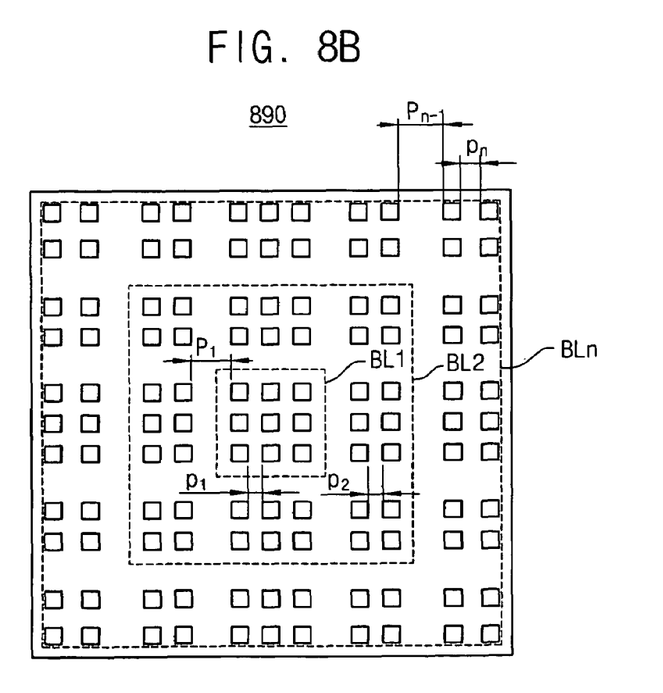
FIG. 8B shows an arrangement of a plurality of light receiving elements in blocks in the CMOS image sensor of FIG. 5, according to an example embodiment of the present invention.

FIG. 8A shows an arrangement of a plurality of micro-lenses in blocks, and FIG. 8B shows an arrangement of a plurality of light receiving elements in blocks, in the CMOS image sensor of FIG. 5 according to an example embodiment of the present invention.

Referring to FIG. 8A, the micro-lens array 800 includes a plurality of micro-lens blocks BL1, BL2, and BLn. When a micro-lens block is disposed nearer to an end of the micro-lens array 800, spacing between adjacent micro-lens blocks is decreased with increased incident angle of light.

For example, a space between the most outside micro-lens block BLn and the previous micro-lens block BLn-1 is narrower than a space between the micro-lens block BLn-2 and the previous micro-lens block BLn-3. (n is a natural number.) That is, a space between the most outside micro-lens block BLn and the previous micro-lens block BLn-1 is a minimum value Rn-1, and a space between the center micro-lens block BL1 and the adjacent micro-lens block BL2 is a maximum value R1.

In addition, a space between adjacent micro-lenses in the center micro-lens block BL1 is r1, and a space between adjacent micro-lenses in the micro-lens block BL2 is r2. In another embodiment of the present invention, the spacing between adjacent micro-lenses may be decreased as the micro-lens block having such adjacent micro-lenses is disposed more toward an end of the micro-lens array 800. Thus, r2 may be less than r1 in another embodiment of the present invention.

Referring to FIG. 8B, the light receiving element array 890 also includes a plurality of light receiving element blocks BL1, BL2, and BLn. When a light receiving element block is disposed nearer an end of the light receiving element array 890, spacing between adjacent light receiving element blocks is increased according to the increased incident angle of light.

For example, the spacing between the most outside light receiving element block BLn and the previous light receiving element block BLn-1 is wider than the spacing between the light receiving element block BLn-2 and the previous light receiving element block BLn-3. (n is a natural number.) That is, the spacing between the most outside light receiving element block BLn and the previous light receiving element block BLn-1 is a maximum value Pn-1, and the spacing between the center light receiving element block BL1 and the adjacent light receiving element block BL2 is a minimum value P1.

In addition, a space between adjacent light receiving elements in the light center receiving element block BL1 is p1, and a space between adjacent light receiving elements in the light receiving element block BL2 is p2. In another embodiment of the present invention, the spacing between adjacent light receiving elements may be increased as the light receiving block having such adjacent light receiving elements is disposed more toward an end of the light receiving element array 890. Thus, p2 may be greater than p1 in another embodiment of the present invention.

In this manner, variation of light intensity depending on an incident angle of light incident on the photodiodes may be reduced. Thus, the photo sensitivity of the photodiodes may be improved.

Such similar effect may be achieved by extending a space between the photodiodes according to the following two manners. First, if a pixel is disposed nearer an end of the pixel array, a size of the pixel is increased. Namely, a size of the pixel is increase in proportion to the incident angle of light. The increased pixel size corresponds to the increased spacing between adjacent light receiving elements described above.

Additionally, increasing a size of a unit pixel may further ensure enough distance (i.e., $A_1$, $B_1$ shown in FIG. 5) between a light shielding layer such as a metal layer and the light incident on a pixel. Thus, the intensity of light incident on the unit pixel is increased for in turn improving the photo sensitivity.

A second manner is extending a distance between pixels for achieving similar effect from shifting positions of the photodiodes. Those having ordinary skill in the art will recognize that the first and second manners may be simultaneously used so as to improve the photo sensitivity of the photodiodes. Further, increase of the pixel size, of a distance between adjacent pixels, and of a distance between adjacent light receiving element blocks may be also accomplished by extending a size of a light receiving element.

In such a CMOS image sensor structure, a space between adjacent elements for converging light, a space between adjacent blocks including the elements for converging light, and a size of a unit pixel may be optionally increased or decreased in at least one of a vertical direction and a horizontal direction with respect to a vertical plane of the optical axis. Furthermore, the present invention may be applied to other types of image sensors such as an active pixel sensor, a passive pixel sensor, a CCD (Charge Coupled Device), and so on.

The CMOS image sensor according to the example embodiments of the present invention may relieve overhead on size extension of the CMOS image sensor, may reduce loss of light intensity at the photodiodes, and may improve photo sensitivity of the photodiodes.

While the example embodiments of the present invention and their advantages have been described in detail, it should be understood that various changes, substitutions and alterations may be made herein without departing from the scope of the invention.

What is claimed is:

1. An image sensor comprising:
   a plurality of micro-lenses, each micro-lens having a neighboring micro-lens at a respective distance that decreases with an incident angle of light converged by the micro-lens; and
   a plurality of light receiving elements, each light receiving element having a neighboring light receiving element at a respective distance that increases with an incident angle of light received by the light receiving element.

2. The image sensor of claim 1, wherein the plurality of micro-lenses are arranged as an array in a plane above the plurality of light receiving elements.

3. The image sensor of claim 2, wherein the incident angle of light converged by the micro-lens increases from a center point of the array.

4. The image sensor of claim 1, wherein the plurality of light receiving elements are arranged as an array in a plane below the plurality of micro-lenses.

5. The image sensor of claim 4, wherein the incident angle of light received by the light receiving element increases from a center point of the array.

6. The image sensor of claim 1, wherein each light receiving element receives light converged by a respective micro-lens.

7. The image sensor of claim 1, further comprising:
   an objective lens disposed above the micro-lenses, wherein the incident angle of light is with respect to an optical axis of the objective lens.

8. The image sensor of claim 1, further comprising:
   a plurality of color filters disposed between the micro-lenses and the light receiving elements.

9. The image sensor of claim 8, wherein each color filter has a neighboring color filter at a respective distance that decreases with an incident angle of light filtered by the color filter.

10. The image sensor of claim 1, further comprising:
    a plurality of metal structures disposed between the micro-lenses and the light receiving elements.

11. The image sensor of claim 10, wherein each metal structure has a neighboring metal structure at a respective distance that decreases with an incident angle of light.

12. The image sensor of claim 1, wherein the micro-lenses are arranged in blocks, and wherein each block has a neighboring block at a respective distance that decreases with the incident angle of light converged by the micro-lenses in the block.

13. The image sensor of claim 12, wherein a distance between neighboring micro-lenses within each block decreases with the incident angle of light.

14. The image sensor of claim 1, wherein the light receiving elements are arranged in blocks, and wherein each block has a neighboring block at a respective distance that increases with the incident angle of light received by the light receiving elements in the block.

15. The image sensor of claim 14, wherein a distance between neighboring light receiving elements within each block increases with the incident angle of light.

16. The image sensor of claim 1, wherein the image sensor is a CIS (CMOS image sensor).

* * * * *